United States Patent
Telefus et al.

(10) Patent No.: US 9,893,627 B1
(45) Date of Patent: Feb. 13, 2018

(54) CURRENT CONTROLLED RESONANT TANK CIRCUIT

(71) Applicant: Flextronics AP, LLC., Broomfield, CO (US)

(72) Inventors: Mark Telefus, Orinda, CA (US); Peter Ramos Yeo, Quezon (PH); Aldimarl Mantilla Navarro, Antipolo (PH); Bahman Sharifipour, Westford, MA (US)

(73) Assignee: Flextronics AP, LLC, Broomfield, CO (US)

( * ) Notice: Subject to any disclaimer, the term of this patent is extended or adjusted under 35 U.S.C. 154(b) by 40 days.

(21) Appl. No.: 14/821,473

(22) Filed: Aug. 7, 2015

Related U.S. Application Data

(60) Provisional application No. 62/035,256, filed on Aug. 8, 2014.

(51) Int. Cl.
*G05F 1/00* (2006.01)
*H02M 3/335* (2006.01)

(52) U.S. Cl.
CPC .............................. *H02M 3/33507* (2013.01)

(58) Field of Classification Search
CPC .............. H02M 2001/0045; H02M 2007/4815
USPC ............ 323/266, 282, 284; 363/21.02, 21.03
See application file for complete search history.

(56) References Cited

U.S. PATENT DOCUMENTS

| | | | | |
|---|---|---|---|---|
| 4,607,323 A | * | 8/1986 | Sokal | H03F 3/2176 330/10 |
| 6,466,460 B1 | * | 10/2002 | Rein | H02M 3/33507 363/21.02 |
| 7,023,183 B1 | * | 4/2006 | Keller | H02M 1/32 323/222 |
| 2005/0077883 A1 | | 4/2005 | Walters | |
| 2010/0195355 A1 | | 8/2010 | Zheng | |
| 2010/0253310 A1 | * | 10/2010 | Fonderie | H02M 7/537 323/311 |
| 2012/0113692 A1 | * | 5/2012 | Telefus | H02M 1/4258 363/37 |
| 2014/0211515 A1 | * | 7/2014 | Tomioka | H02M 3/158 363/21.02 |

* cited by examiner

*Primary Examiner* — Gary Nash
(74) *Attorney, Agent, or Firm* — Haverstock & Owens LLP

(57) ABSTRACT

A cascade power system includes a non-isolated buck converter in cascade with an isolated Class-E resonant circuit, where the Class-E resonant circuit operates at high frequency, for example 4 Mhz. Further, the non-isolated buck converter is configured as a current source coupled to the Class-E resonant circuit which provides a buck converter output voltage as input to the Class-E resonant circuit. The Class-E resonant circuit includes capacitive isolation for the cascade power system output. The Class-E resonant circuit and the capacitive isolation are configured such that impedance matching for the resonant tank of the Class-E resonant circuit is independent of an output load condition.

20 Claims, 3 Drawing Sheets

US 9,893,627 B1

CURRENT CONTROLLED RESONANT TANK CIRCUIT

RELATED APPLICATIONS

This Patent Application claims priority under 35 U.S.C. 119 (e) of the U.S. Provisional Application Ser. No. 62/035,256, filed Aug. 8, 2014, and entitled "CURRENT RESONANT TANK CIRCUIT". This application incorporates U.S. Provisional Application Ser. No. 62/035,256 in its entirety by reference.

FIELD OF THE INVENTION

The present invention is generally directed to the field of power converters. More specifically, the present invention is directed to a power converter having a current controlled resonant tank circuit.

BACKGROUND OF THE INVENTION

Presently, there is a high demand for efficient power converters that address the power needs of commercial products such as computers and cell phones. As a result, multiple different isolated power converter topologies have been developed to meet this ever increasing demand such as flyback, half-bridge and full-bridge converters. Further, to address power factor correction (PFC) concerns while still isolating the main power supply from the output, the prior art has progressed toward numerous "two-stage" power converters wherein the first stage includes a non-isolated boost converter and the second stage includes an isolated converter such as the flyback, half-bridge and full-bridge converters. This is primarily because boost and half-bridge converters have a common ground with the controller IC, and therefore a simple way to close the feedback loop. However, these "two-stage" power converters have the drawbacks of increased design complexity, decreased energy conversion efficiency, increased component counts, increased printed circuit board (PCB) size, and therefore increased cost.

A block diagram of a prior art regulated power apparatus 100 is shown in FIG. 1. The apparatus 100 is a two stage boost half-bridge power converter. The apparatus 100 generally includes an input filter 102, a rectifier 104, a two stage converter 106 including a boost converter 116 (first stage) and a half bridge converter 114 (second stage), a transformer 108, an output filter 110 and a feedback control 112.

The input filter 102 is coupled to receive an AC input signal Vin and to filter out electromagnetic and radio frequency interference/noise. The input filter 102 outputs a filtered AC signal to the rectifier 104. Upon receiving the signal, the rectifier 104 generates an unregulated direct current (DC) voltage and outputs that unregulated DC voltage to the coupled input of the boost converter 116. Typically, the boost converter 116 receives the unregulated DC voltage from the rectifier 104 and generates a boosted or increased voltage. This increased voltage is a regulated DC voltage that is greater than the input unregulated DC voltage. It should be noted that it is well known in the art that unregulated voltage is voltage that is allowed to vary with changes in the load of the circuit and/or changes in the power source voltage. Correspondingly, it is also well known in the art that regulated voltage is voltage that is controlled such that a sufficiently constant output voltage is maintained despite load and/or power source variation. The half bridge converter 114 receives the increased regulated voltage and generates a converted DC signal that is ideally a square wave signal that is output across the inputs to the transformer 108. The transformer 108 converts the DC square wave to a desired output voltage depending on the turn ratio of the transformer 108. Often the desired output voltage is 5, 12 or 24V. The AC voltage signal output from the transformer 108 is input to an output filter 110, which filters out harmonic noise due to the power circuit 100 and converts the AC signal to DC. The DC voltage signal Vout is output to an electrical device (not shown) and a feedback control 112. The feedback control 112 senses a power change in the DC voltage signal Vout and controls a duty cycle of a regulation switching element within the boost converter 116 to supply a compensating power to correct the power change in the DC voltage signal Vout.

One disadvantage of this type of power system is that due to regulations requiring isolation of the main power supply and powered electrical devices, the power apparatus includes an isolating transformer. This results in increased design complexity, increased component counts, increased PCB size, and therefore increased cost.

SUMMARY OF THE INVENTION

Embodiments are directed to a cascade power system including a non-isolated buck converter in cascade with an isolated Class-E resonant circuit, where the Class-E resonant circuit operates at high frequency, for example 4 Mhz. Further, the non-isolated buck converter is configured as a current source coupled to the Class-E resonant circuit which provides a buck converter output voltage as input to the Class-E resonant circuit. The Class-E resonant circuit includes capacitive isolation for the cascade power system output. The Class-E resonant circuit and the capacitive isolation are configured such that impedance matching for the resonant tank of the Class-E resonant circuit is independent of an output load condition.

In an aspect, a power converter is disclosed that includes a non-isolated buck converter and an isolated Class-E resonant tank. The non-isolated buck converter has a first switching element. The non-isolated buck converter receives a rectified power signal having an unregulated voltage and generates a buck converter output voltage. The isolated Class-E resonant circuit has a second switching element and a resonant tank. The resonant tank has an impedance matched to enable resonance at an operating switching frequency of the second switching element. The isolated Class-E resonant circuit is coupled with the non-isolated buck converter for receiving the buck converter output voltage and generating a converted voltage. A galvanic isolation circuit is coupled with the isolated Class-E resonant circuit for receiving the converted voltage and generating an output voltage. Impedance matching for the resonant tank is independent of an output load condition of an output load coupled to the galvanic isolation circuit. In some embodiments, the isolated Class-E resonant circuit comprises a Class-E amplifier. In some embodiments, the converted voltage is a square wave voltage. In some embodiments, the first switching element and the second switching element each comprise a transistor. In some embodiments, the second switching element operates at a switching frequency of about 4 Mhz. In some embodiments, the power converter further comprises an input rectifier for receiving an AC input signal and generating the rectified power signal having the unregulated voltage. In some embodiments, the power converter further comprises an input filter for filtering out electromagnetic and radio frequency interference from the AC input signal. In some embodiments, the power converter further comprises an output rectifier for receiving the output voltage from the galvanic isolation circuit and generating a rectified DC output voltage. In some embodiments, the power converter further comprises an output filter for filtering out electromagnetic and radio frequency interference from the output voltage. In some embodiments, the power converter further comprises a feedback control circuit coupled to sense the output voltage and to provide a corresponding signal to the non-isolated buck converter.

In another aspect, a power system is disclosed that includes an electronic device for receiving an output voltage, a power supply for generating an AC input signal, and a power converter coupled between the power supply and the electronic device. The power converter includes an input rectifier, a non-isolated buck converter and an isolated Class-E resonant tank. The input rectifier receives the AC input signal and generates a rectified power signal having an unregulated voltage. The non-isolated buck converter has a first switching element. The non-isolated buck converter receives a rectified power signal having an unregulated voltage and generates a buck converter output voltage. The isolated Class-E resonant circuit has a second switching element and a resonant tank. The resonant tank has an impedance matched to enable resonance at an operating switching frequency of the second switching element. The isolated Class-E resonant circuit is coupled with the non-isolated buck converter for receiving the buck converter output voltage and generating a converted voltage. A galvanic isolation circuit is coupled with the isolated Class-E resonant circuit for receiving the converted voltage and generating an output voltage. Impedance matching for the resonant tank is independent of an output load condition of an output load coupled to the galvanic isolation circuit.

BRIEF DESCRIPTION OF THE DRAWINGS

Several example embodiments are described with reference to the drawings. The example embodiments are intended to illustrate, but not to limit, the invention. The drawings include the following figures.

DETAILED DESCRIPTION OF THE EMBODIMENTS

Embodiments of the present application are directed to a power converter. Those of ordinary skill in the art will realize that the following detailed description of the power converter is illustrative only and is not intended to be in any way limiting. Other embodiments of the power converter will readily suggest themselves to such skilled persons having the benefit of this disclosure.

Reference will now be made in detail to implementations of the power converter as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The cascade power system, method and apparatus described herein is designed to provide a more efficient manner of converting power supplies. Unlike the stage based systems of the prior art that use transformers as isolation means between power system input voltage and output voltage, the cascade topology of the cascade power system described herein is able to provide a capacitor isolation means. Specifically, a converter cascade circuit on an input side of the power system includes a non-isolated buck converter in cascade with an isolated Class-E resonant circuit, where the Class-E resonant circuit operates at high frequency, for example 4 Mhz. Further, the non-isolated buck converter is configured as a current source coupled to the Class-E resonant circuit, thereby providing a current controlled resonant circuit. Moreover, by configuring the isolated converter in a cascade with the non-isolated converter, the cascade power system is able to gain the benefits of both. A feedback mechanism enables regulation of the output voltage as well as control of the current source for energy transfer through the Class-E resonant circuit.

Figure 1:
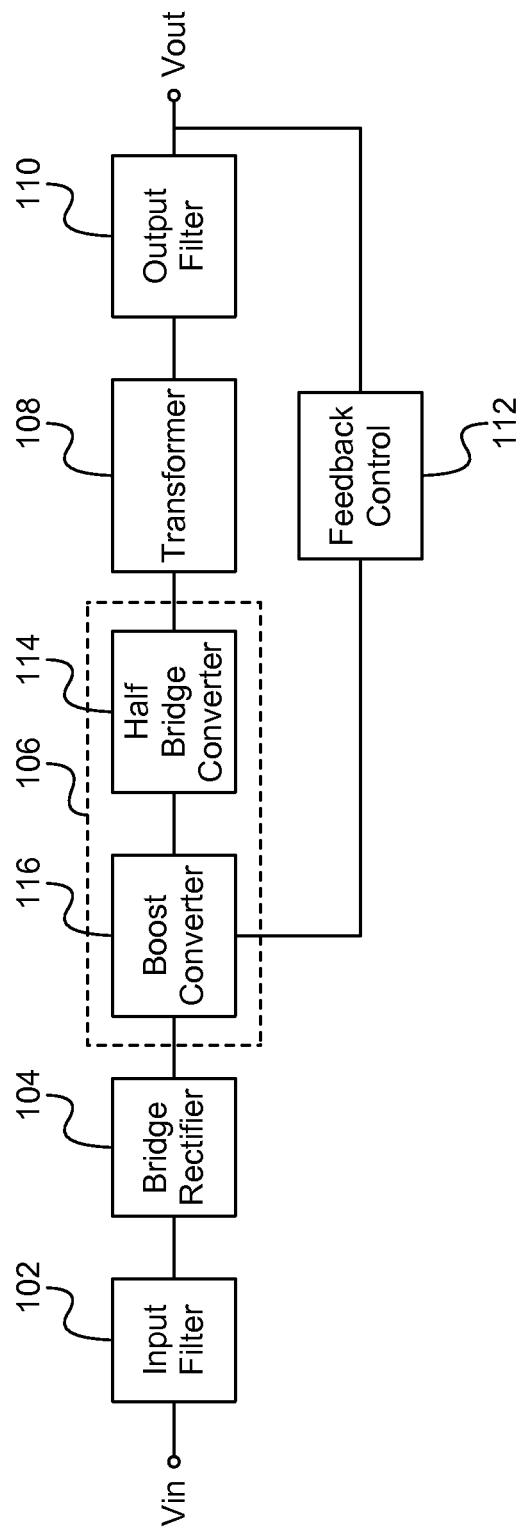
FIG. 1 illustrates a block diagram of a prior art regulated power apparatus.
Figure 2:
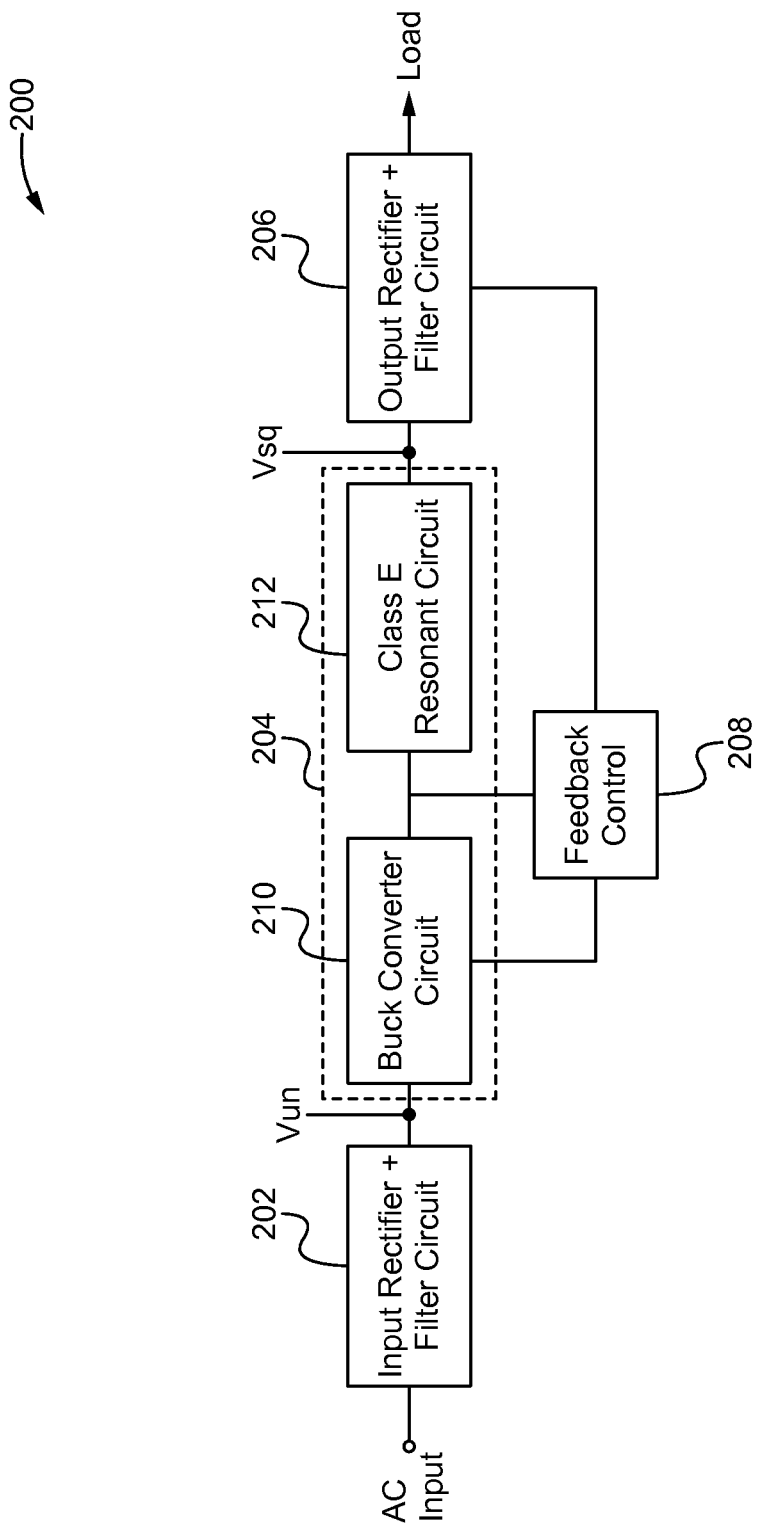
FIG. 2 illustrates a functional block diagram of a cascade power system according to some embodiments.

FIG. 2 illustrates a functional block diagram of a cascade power system according to some embodiments. The cascade power system 200 of FIG. 2 includes an input rectifier and filter circuit 202, a converter cascade circuit 204, an output rectifier and filter circuit 206 and a feedback control circuit 208. The converter cascade circuit 204 includes a buck converter circuit 210 and a Class-E resonant circuit 212. In some embodiments, the power system 200 includes any number of additional filters, rectifiers, converters, transformers, controllers and other devices well known in the art such as capacitors, diodes, resistors, inductors, transistors, etc. In some embodiments, the power system 200 includes additional converters configured to operate as power factor correction (PFC) components. Alternatively, the buck converter 210 operates as a PFC component by ensuring that the input current and a line frequency are in the same phase. The input rectifier and filter circuit 202 is coupled to a power supply (not shown) and the converter cascade circuit 204. In operation, the input rectifier and filter circuit 202 receives an AC input voltage (Vin) from the power supply and filters out electromagnetic interference (EMI), radio frequency interference (RFI) and other types of noise from the signal Vin such that noise from the power source is able to be minimized, if not eliminated. Filtering is accomplished using any circuit capable of effectively filtering out noise as are well known in the art. The filtered AC voltage is converted into unregulated DC voltage (Vun). The input rectifier and filter circuit 202 outputs the unregulated DC voltage Vun to the converter cascade circuit 204. In some embodiments, the filtered AC voltage is converted into unregulated DC voltage (Vun) using a diode bridge. Alternatively, the filtered AC voltage is converted into unregulated DC voltage (Vun) using any type of AC to DC converting circuitry as are well known in the art.

The converter cascade circuit 204 includes an isolated converter and a non-isolated converter. In the exemplary embodiment shown in FIG. 2, the buck converter circuit 210 is the non-isolated converter and the Class-E resonant circuit 212 is the isolated converter. Specifically, the cascade topology of the converter cascade circuit 204 enables the output voltage of the converter cascade circuit 204 to be kept isolated without sacrificing the ability to easily regulate the circuit 204 with the feedback control circuit 208. In some embodiments, the Class-E resonant circuit 212 includes capacitor isolation circuitry for isolating the circuit 212 from the output of the power system 200. Additionally, it is understood that other benefits associated with each of the individual converters 210, 212 are also achieved in the cascade topology. The converter cascade circuit 204 is coupled to the input rectifier and filter circuit 202, the output rectifier and filter circuit 206 and the feedback control circuit 208. The converter cascade circuit 204 inputs the unregulated DC voltage Vun output by the input rectifier and filter circuit 202, and the buck converter circuit 210 "steps down"/lowers the unregulated DC voltage Vun to a predetermined regulated voltage. In each "step down" embodiment, as a result of "stepping down" the voltage, the cascade power system 200 is able to operate with better efficiency than power systems that use "step up" non-isolated converters. Specifically, this is because, as is known in the art, components with lower voltage ratings are inherently more efficient than those with higher voltage ratings.

Furthermore, by operating at a stepped down/lower voltage, the system as a whole is less expensive due to savings on component size.

The Class-E resonant circuit 212 inputs the regulated DC voltage and outputs a square wave voltage (Vsq) signal that pulses between 0V and the input regulated DC voltage. The pulses are output by the Class-E resonant circuit 212 to the output rectifier and filter circuit 206.

The output rectifier and filter circuit 206 is coupled to the Class-E resonant circuit 212 and an output device (not shown). The output rectifier and filter circuit 206 inputs the voltage signal Vsq output from the Class-E resonant circuit 212 and filters out noise. This filtered DC output voltage (Vout) is then output to the output device.

The feedback control circuit 208 can include any feedback circuitry capable of providing a feedback signal representative of a state or value of the output voltage Vout as are well known in the art. In some embodiments, the feedback circuitry includes an optical coupler for providing the feedback signal from the output side of the capacitor isolation means of the Class-E resonant circuit 212 to the input side of the capacitor isolation means. The feedback control circuit 208 can include any integrated circuit (IC) controller as are well known in the art. In some embodiments, the feedback control circuit 208 includes any combination of multiplexers, operational amplifiers, and comparators (not shown). Alternatively, the feedback control circuit 208 includes any other combination of circuitry that functions to control the output of the converters 210, 212 as are well known in the art. The feedback control circuit 208 is coupled to the output rectifier and filter circuit 206 and the buck converter circuit 210. The feedback control circuit 208, the buck converter circuit 210, the Class-E inverter circuit 212 and the output rectifier and filter circuit 206 form a feedback loop.

Figure 3:
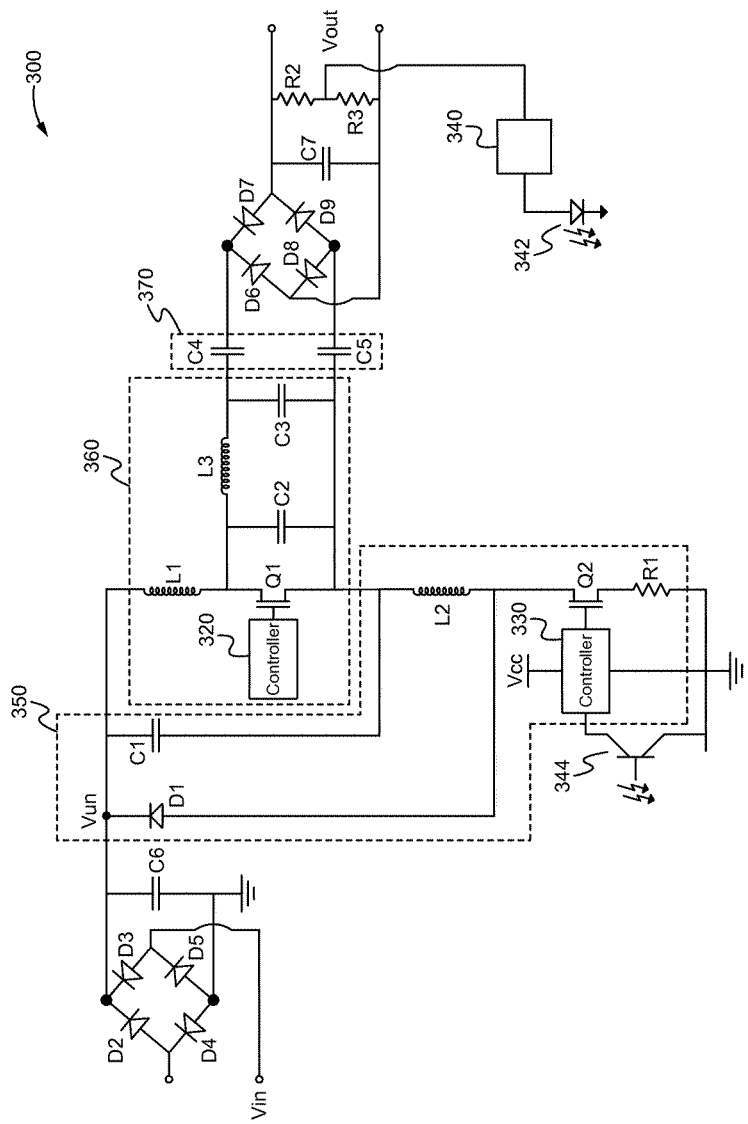
FIG. 3 illustrates an exemplary schematic of the cascade power system architecture according to an embodiment.

FIG. 3 illustrates an exemplary schematic of the cascade power system architecture according to an embodiment. The schematic is substantially similar to the functional block diagram shown in FIG. 2 along with additional details described herein. It is understood that alternative schematics can be used to implement the functional blocks of FIG. 2. The cascade power system circuit 300 includes an input rectifier and filter, a buck converter circuit, a Class-E resonant circuit 360, a capacitive isolation 370, an output rectifier and filter circuit, and a feedback control circuit.

The input rectifier and filter circuit includes a rectifier of four diodes D2, D3, D4, and D5, wherein the cathodes of diode D2 and diode D3 are coupled, the anodes of diode D4 and diode D5 are coupled, and the anodes of diode D2 and diode D3 are coupled to the cathodes of diode D4 and diode D5 respectively forming a loop. Further, a first input line is coupled to the anode of diode D2 and the cathode of diode D4, and a second input line is coupled to the anode of diode D3 and the cathode of diode D5. Finally, a first output line of the rectifier is coupled to the cathode of diode D2 and diode D3, and a second output line is coupled to the anode of diode D4 and diode D5. In this manner, as is well known in the art, the AC input voltage Vin is converted to unregulated DC voltage Vun that is output on the first and second output lines. Alternatively, other rectifying circuitry can be used as are well known in the art. The input rectifier and filter circuit also includes a filter that functions to filter out unwanted noise. In some embodiments, a choke element is used as the filter, where the choke element can be a pair of inductors for "smoothing out" ripples/noise in the current. Alternatively, the choke element can be any suitable filtering element or element as are well known in the art. One or more capacitors can be used in addition to or instead of the choke element. The one or more capacitors can be used as filter elements to "smooth" the output of the rectifier. The filter is generally shown in FIG. 3 as a capacitor C6. A first terminal of the capacitor C6 is coupled to the first output line of the rectifier for receiving the input unregulated DC voltage Vun. It is understood that other noise filtering circuitry is able to be used in the input rectifying and filter circuit for filtering the input voltage noise.

The buck converter circuit 350 includes a transistor Q2, a resistor R1 and a controller 330. The controller 330 is configured to drive the transistor Q2. The buck converter circuit 350 also includes a current source that is coupled to the output of the input rectifier and filter circuit. In the exemplary schematic of FIG. 3, the current source is coupled to a first terminal of the capacitor C6. The current source includes a diode D1, a capacitor C1 and an inductor L2. A cathode of the diode D1 is coupled to the first terminal of the capacitor C6, a first terminal of the capacitor C1 and a first input of the Class-E resonant circuit 360. An anode of the diode D1 is coupled to a first terminal of the transistor Q2 and a second terminal of inductor L2. A second terminal of the capacitor C1 is coupled to a first terminal of inductor L2 and a second input of Class-E resonant circuit 360. The inductor L2 functions as an energy storage power inductor for the buck converter circuit 350. The first terminal of the inductor L2 is coupled to the second input of the Class-E resonant circuit 360 and the second terminal of the capacitor C1. The second terminal of the inductor L2 is coupled to the anode of diode D1 and the first terminal of the transistor Q2.

The Class-E resonant converter 360 includes a controller 320, a transistor Q1, an inductor L1, a capacitor C2, an inductor L3 and a capacitor C3. The controller 320 is configured to drive the transistor Q1. In some embodiments, the transistor Q1 is driven at a 50% duty cycle at a frequency of 4 Mhz. A first terminal of the inductor L1 is the first input of the Class-E resonant circuit 360. The first terminal of the inductor L1 is coupled to the first terminals of the capacitors C1 and C6 and the cathode of the diode D1. A second terminal of the inductor L1 is coupled to a first terminal of the transistor Q1. A second terminal of the transistor Q1 is the second input of the Class-E resonant circuit 360. The second terminal of the transistor Q1 is coupled to the second terminal of the capacitor C1 and the first terminal of the inductor L2. The controller 320 is coupled to a third terminal of the transistor Q1. A first terminal of the capacitor C2 is coupled to the second terminal of the inductor L1, the first terminal of the transistor Q1 and a first terminal of the inductor L3. A second terminal of the capacitor C2 is coupled to the second terminal of the transistor Q1, a second terminal of the capacitor C3 and to a first terminal of a capacitor C5 included within the capacitive isolation 370. A second terminal of the inductor L3 is coupled to a first terminal of the capacitor C3 and to a first terminal of a capacitor C4 included within the capacitive isolation 370. In the exemplary embodiment shown in FIG. 3, the Class-E resonant circuit has a single transistor.

The capacitive isolation 370 includes the capacitor C4 and the capacitor C5. The first terminal of the capacitor C4 is coupled to the second terminal of the inductor L3 and the first terminal of the capacitor C3. A second terminal of the capacitor C4 is coupled to cathodes of diodes D6 and D7 included within the output rectifier and filter circuit. The first terminal of the capacitor C5 is coupled to the second terminal of the transistor Q1, the second terminal of the capacitor C2 and the second terminal of the capacitor C3. A second terminal of the capacitor C5 is coupled to anodes of diodes D8 and D9 included within the output rectifier and filter circuit.

In the exemplary configuration shown in FIG. 3, the capacitive isolation 370 is shown separate from the Class-E resonant circuit 360. It should be noted that the capacitive isolation 370 is able to be considered a component of the Class-E resonant circuit 360, but has been separated into an individual component for the purposes of this description. In general, the capacitive isolation circuitry can be considered a component of the Class-E resonant circuit or as a separate component than the Class-E resonant circuit.

The output rectifier and filter circuit includes a rectifier of four diodes D6, D7, D8, and D9, where the cathodes of diode D6 and diode D7 are coupled, the anodes of diode D8 and diode D9 are coupled, and the anodes of diode D6 and diode D7 are coupled to the cathodes of diode D8 and diode D9 respectively forming a loop. Further, a first output line is coupled to the anode of diode D7 and the cathode of diode D9, and a second output line is coupled to the anode of diode D6 and the cathode of diode D8. Finally, a first output line of the capacitive isolation 370 is coupled to the cathodes of diode D6 and diode D7, and a second output line of the capacitive isolation 370 is coupled to the anodes of diode D8 and diode D9. In this manner, the AC voltage output from the capacitive isolation 370 is converted to rectified DC voltage that is output on the first and second output lines. Alternatively, other rectifying circuitry can be used as are well known in the art. The output rectifier and filter circuit also includes a filter that functions to filter out unwanted noise. The filter is generally shown in FIG. 3 as a capacitor C7. The capacitor C7 is coupled to the first and second output lines of the rectifier for receiving the rectified DC voltage. The voltage across the capacitor C7 is the regulated DC output voltage Vout. It is understood that other noise filtering circuitry is able to be used in the input rectifying and filter circuit for filtering the input voltage noise.

The cascade power system 300 includes the feedback control circuit. In some embodiments, the feedback control circuit includes a voltage divider comprising resistors R2 and R3, a secondary controller 340 and an optical coupler circuit. The secondary controller 340 may simply be a voltage sensing circuit. The optical coupler circuit includes two galvanically isolated components, an optical diode 342 coupled to the secondary controller 340 and an optical transistor 344 coupled to the controller 330. The optical diode 342 provides optical communication with the optical transistor 344 across the isolation barrier formed by the capacitive isolation 370. The optical coupler circuit in cooperation with the secondary controller 340 provides feedback to the controller 330. The controller 330 accordingly adjusts the duty cycle of the transistor Q2 to compensate for any variances in the output voltage Vout.

The exemplary cascade power system circuit 300 shown in FIG. 3 implements an optical coupler circuit for feedback control. It is understood that alternative types of feedback control can be used. In some embodiments, the cascade power system circuit 300 includes additional capacitors, inductors, resistors, diodes, transistors, etc.

In operation, while the transistor Q2 is ON, current Ipri flows from the AC input supply through the capacitor C1, the inductor L2 and the transistor Q2, thereby charging the capacitor C1 and storing energy in the inductor L2. The amount of charge in the capacitor C1, as determined by the duty cycle of the transistor Q2, determines the output voltage of the buck converter circuit 350, which is the voltage across the capacitor C1. Charge in the capacitor C1 is transferred to the output of the cascade power system circuit 300 by high frequency switching of the transistor Q1. The controller 320 drives the transistor Q1 independently of the operation of the transistor Q2. High frequency switching of the transistor Q1 results in an AC signal across the capacitor C3, the voltage amplitude of which is a function of the voltage across the capacitor C1. The AC signal across the capacitor C3 is passed through and stepped down by the capacitive isolation 370 and rectified by the output rectifier and filter circuit as the output voltage Vout across the output capacitor C7.

While the transistor Q2 is OFF, energy stored in the inductor L2 generates current Ipri, thereby functioning as a current source. The current Ipri flows from the inductor L2, through the diode D1 and the capacitor C1, thereby charging the capacitor C1. Charge in capacitor C1 is transferred to the output of the cascade power system circuit 300 by high frequency switching of the transistor Q1.

The transistor Q1 has a high switching frequency of about 4 Mhz or higher, as controlled by the controller 320. The high frequency operation of the Class-E resonant circuit 360 enables energy to efficiently pass through the capacitive isolation 370 because capacitor impedance decreases with increasing frequency while the isolation capabilities remain the same. At lower frequencies, such as 100-400 Khz, there are high losses across the capacitive isolation due to the greater impedance of the capacitors at the lower frequency. This is why prior art power conversion systems operating at lower frequencies are implemented using transformers instead of capacitors for isolation.

The output voltage of the Class-E resonant circuit varies with the load. The output voltage goes higher at lower loads and requires adjustments at the input side of the Class-E resonant circuit in order to maintain the output voltage at the regulated level, for example 5V, with the same operating frequency. The system is configured to lower the output voltage of the buck converter circuit 350 that is feeding the input of the Class-E resonant circuit 360, where the output voltage of the buck converter circuit 350 is the voltage across the capacitor C1. The output voltage of the buck converter circuit 350 is input to the Class-E resonant circuit 360. The feedback control circuit is configured to signal the buck converter circuit 350 to adjust the output voltage of the buck converter circuit 350. The feedback control circuit provides a feedback signal representative of a state or value of the output voltage Vout as is well known in the art. In some embodiments, the feedback control circuit includes an optical coupler for providing the feedback signal from the feedback circuitry 340 to the controller 330. The controller 330 controls a duty cycle of the transistor Q2 so as to regulate the output voltage Vout. For example, when the output voltage Vout is at the regulated voltage, for example 5V, the transistor Q2 is turned OFF. When the output voltage Vout drops below a threshold voltage that is less than the regulated voltage, the transistor Q2 is turned ON. Adjusting the duty cycle of the transistor Q2 adjusts the voltage across the capacitor C1, which in turn adjusts a voltage amplitude of the AC signal output from the Class-E resonant circuit 360, thereby adjusting the output voltage Vout.

The voltage across the capacitor C1 is limited to a maximum value, for example 40V, because the voltage across the capacitor C1 is a function of the current Ipri, the capacitance C of the capacitor C1 and the timing: $\Delta V = (Ipri*dt)/C$. The timing and current Ipri are controlled by the duty cycle of the transistor Q2. In this manner, controlling the duty cycle of the transistor Q2 controls a current source Ipri for charging the capacitor C1, the stored energy from which is transferred to the output load via the Class-E resonant circuit.

The cascade power system is considered adaptive in that the output voltage of the buck converter circuit adjusts to regulate the system output voltage Vout. The output voltage of the buck converter is supplied as input to the Class-E resonant circuit that is used to transfer energy through a capacitive isolation using high frequency switching. Adjusting the output voltage of the buck converter circuit adjusts the input to the Class-E resonant circuit, which adjusts a voltage amplitude of the sinusoidal signal passing through the capacitive isolation, thereby adjusting the output voltage Vout.

The cascade power system also enables the impedance matching for the resonant tank of the Class-E resonant circuit to be independent of the output load condition. In a resonant tank, the impedances of the resonant tank elements are tuned to enable resonance at a given transistor switching frequency. When a transformer is used as an isolation means, under certain load conditions the reflected voltage from the transformer affects the resonant tank impedance and takes the resonant tank off-resonance which negatively impacts efficiency. In this case the impedance matching for the resonant tank is dependent on the load condition. With the capacitive isolation of the present cascade power system, there is a single current path from the resonant tank of the Class-E resonant circuit to the output load. The load condition does not affect the impedance of the resonant tank. In this case the impedance matching for the resonant tank is independent on the load condition.

In the embodiments described above, the Class-E resonant circuit is described as operating at 4 Mhz or higher. It is understood that the Class-E resonant circuit can be configured to operate at other frequencies. As the frequency is lowered, the size of the components in the resonant circuit increase. At 4 Mhz, the inductors in the resonant circuit, for example the inductors L1 and L3, are a fraction of a microhenry and the capacitors, for example the capacitors C2 and C3, are a fraction of a microfarad. Since the frequency is so high, some of the components shown in the schematic of FIG. 3 may not represent actual physical components. For example, the inductors L1 and L3 may be implemented simply as metal traces on the printed circuit board, without need for a magnetic core. The air surrounding the metal trace functions as the core.

The present application has been described in terms of specific embodiments incorporating details to facilitate the understanding of the principles of construction and operation of the power converter. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A power converter comprising:
   a. a non-isolated buck converter having a first switching element, wherein the non-isolated buck converter receives a rectified power signal having an unregulated voltage and generates a buck converter output voltage;
   b. an isolated Class-E resonant circuit having a second switching element and a resonant tank, wherein the resonant tank has an impedance matched to enable resonance at an operating switching frequency of the second switching element, wherein the operating switching frequency of the second switching element is fixed and the resonant tank has a fixed impedance matched to enable resonance at the fixed operating switching frequency of the second switching element, further wherein the isolated Class-E resonant circuit is coupled with the non-isolated buck converter for receiving the buck converter output voltage and generating a converted voltage; and
   c. a capacitive isolation circuit coupled with the isolated Class-E resonant circuit for receiving the converted voltage and generating an output voltage, wherein impedance matching for the resonant tank is independent of an output load condition of an output load coupled to the capacitive isolation circuit, further wherein the capacitive isolation circuit provides a single current path from the resonant tank of the isolated Class-E resonant circuit to the output load.

2. The power converter of claim 1 wherein the isolated Class-E resonant circuit comprises a Class-E amplifier.

3. The power converter of claim 1 wherein the converted voltage is a square wave voltage.

4. The power converter of claim 1 wherein the first switching element and the second switching element each comprise a transistor.

5. The power converter of claim 1 wherein the second switching element operates at a switching frequency of about 4 Mhz.

6. The power converter of claim 1 further comprising an input rectifier for receiving an AC input signal and generating the rectified power signal having the unregulated voltage.

7. The power converter of claim 6 further comprising an input filter for filtering out electromagnetic and radio frequency interference from the AC input signal.

8. The power converter of claim 1 further comprising an output rectifier for receiving the output voltage from the capacitive isolation circuit and generating a rectified DC output voltage.

9. The power converter of claim 8 further comprising an output filter for filtering out electromagnetic and radio frequency interference from the rectified DC output voltage.

10. The power converter of claim 8 further comprising a feedback control circuit coupled to sense the rectified DC output voltage and to provide a corresponding signal to the non-isolated buck converter.

11. The power system of claim 1 wherein the isolated Class-E resonant circuit further comprises a controller, a first inductor, a second inductor, a first capacitor and a second capacitor, and the capacitive isolation circuit comprises a third capacitor and a fourth capacitor, further wherein a first terminal of the first inductor is a first input to the isolated Class-E resonant circuit, a second terminal of the first inductor is connected to a first terminal of the second switching element, a second terminal of the second switching element is a second input to the isolated Class-E resonant circuit, a third terminal of the second switching element is connected to the controller, a first terminal of the second inductor is connected to the second terminal of the first inductor, the first terminal of the second switching element and a first terminal of the first capacitor, a second terminal of the first capacitor is connected to the second terminal of the second switching element, a second terminal of the second inductor is connected to a first terminal of the second capacitor and a first terminal of the third capacitor, a second terminal of the second capacitor is connected to the second terminal of the first capacitor, the second terminal of the second switching element and a first terminal of the fourth capacitor, a second terminal of the third capacitor is a first output of the capacitive isolation circuit, and a second terminal of the fourth capacitor is a second output of the capacitive isolation circuit.

12. A power system comprising:
   a. an electronic device for receiving an output voltage;
   b. a power supply for generating an AC input signal; and
   c. a power converter coupled between the power supply and the electronic device comprising:
      i. an input rectifier for receiving the AC input signal and generating a rectified power signal having an unregulated voltage;
      ii. a non-isolated buck converter having a first switching element, wherein the non-isolated buck converter receives a rectified power signal having an unregulated voltage and generates a buck converter output voltage;
      iii. an isolated Class-E resonant circuit having a second switching element operating at a fixed switching frequency and a resonant tank, wherein the resonant tank has a fixed impedance matched to enable resonance at the fixed switching frequency of the second switching element, further wherein the isolated Class-E resonant circuit is coupled with the non-isolated buck converter for receiving the buck converter output voltage and generating a converted voltage; and
      iv. a capacitive isolation circuit coupled with the isolated Class-E resonant circuit for receiving the converted voltage and generating an output voltage, wherein impedance matching for the resonant tank is independent of an output load condition of the electronic device coupled to the capacitive isolation circuit, wherein the capacitive isolation circuit provides a single current path from the resonant tank of the isolated Class-E resonant circuit to the electronic device.

13. The power system of claim 12 wherein the isolated Class-E resonant circuit comprises a Class-E amplifier.

14. The power system of claim 12 wherein the converted voltage is a square wave voltage.

15. The power system of claim 12 wherein the first switching element and the second switching element each comprise a transistor.

16. The power system of claim 12 wherein the second switching element operates at a switching frequency of about 4 Mhz.

17. The power system of claim 12 further comprising an input filter for filtering out electromagnetic and radio frequency interference from the AC input signal.

18. The power system of claim 12 further comprising an output rectifier coupled between the capacitive isolation circuit and the electronic device.

19. The power system of claim 18 further comprising an output filter for filtering out electromagnetic and radio frequency interference from the output voltage.

20. The power system of claim 12 further comprising a feedback control circuit coupled to sense the output voltage and to provide a corresponding signal to the non-isolated buck converter.

* * * * *